(12) United States Patent
Wong

(10) Patent No.: US 7,392,836 B2
(45) Date of Patent: Jul. 1, 2008

(54) FLAT-PLATE HEAT PIPE CONTAINING CHANNELS

(75) Inventor: Shwin-Chung Wong, Hsin-Chu (TW)

(73) Assignee: National Tsing Hua University, Hsin-chu (TW)

( * ) Notice: Subject to any disclaimer, the term of this patent is extended or adjusted under 35 U.S.C. 154(b) by 147 days.

(21) Appl. No.: 11/265,125

(22) Filed: Nov. 3, 2005

(65) Prior Publication Data
US 2007/0056714 A1    Mar. 15, 2007

(30) Foreign Application Priority Data
Sep. 15, 2005    (TW) .............................. 94131788 A

(51) Int. Cl.
*H05K 7/20* (2006.01)
(52) U.S. Cl. .............. 165/104.26; 361/700; 165/104.33
(58) Field of Classification Search ............ 165/104.26, 165/104.33; 361/700
See application file for complete search history.

(56) References Cited

U.S. PATENT DOCUMENTS

| | | | |
|---|---|---|---|
| 4,833,567 A * | 5/1989 | Saaski et al. ................ | 361/700 |
| 5,560,423 A * | 10/1996 | Larson et al. .......... | 165/104.26 |
| 5,761,037 A * | 6/1998 | Anderson et al. ........... | 361/700 |
| 6,085,831 A * | 7/2000 | DiGiacomo et al. ..... | 165/104.33 |
| 6,227,287 B1 * | 5/2001 | Tanaka et al. ............... | 165/80.4 |
| 6,397,935 B1 * | 6/2002 | Yamamoto et al. ...... | 165/104.26 |
| 6,564,860 B1 * | 5/2003 | Kroliczek et al. ....... | 165/104.26 |
| 6,679,318 B2 * | 1/2004 | Bakke ..................... | 165/104.26 |
| 6,863,117 B2 * | 3/2005 | Valenzuela .............. | 165/104.26 |
| 7,032,652 B2 * | 4/2006 | Wang et al. ............. | 165/104.26 |
| 2006/0213648 A1 * | 9/2006 | Chen et al. .............. | 165/104.33 |

FOREIGN PATENT DOCUMENTS

JP        03087596 A  *  4/1991

* cited by examiner

*Primary Examiner*—Allen J Flanigan

(57) ABSTRACT

Heat from a heat generating device such as a CPU is dissipated by a heat spreader containing a cycled two-phase vaporizable coolant. The coolant cycles inside a closed metal chamber, which has an upper section and a lower section. The lower section contains a wick layer, a part or parts of which serves as an evaporator. The upper section is composed of a set of channels. The channel walls contain a plurality of cut-off openings over the evaporator region to allow for vapor distribution efficiently. The liquid coolant in the evaporator is vaporized by the heat from the heat generating device. The coolant vapor can prevail in the channels by either directly entering the adjacent channels or indirectly through lateral conduits formed with the wall openings. The vapor condenses on the channel, walls to liberate latent heat which is then dissipated out through the top chamber wall. The condensed coolant is directly collected by the lower-section wick and further flows back to the wick evaporator by capillary action, thereby cycling the coolant.

12 Claims, 6 Drawing Sheets

FLAT-PLATE HEAT PIPE CONTAINING CHANNELS

BACKGROUND OF THE INVENTION (1) Field of the Invention

This invention relates to a heat pipe, in particular, a grooved flat-plate heat pipe used for heat dissipation for electronic integrated circuit (IC) chips, such as a central processing unit (CPU), or other high-flux heat sources.

(2) Brief Description of Related Art

The latest generation of Pentium IV CPU generates power more than 100 watts (Joule/sec). In order to maintain its normal performance and avoid overheating of the unit, more effective heat dissipating mechanism is needed. A method uses a flat-plate heat pipe, as shown in FIG. 1, for spreading the heat generated by a semiconductor device. An enclosed and vacuumed metal chamber 11, whose inner surface covered with a layer of wick 10, contains a working liquid undergoing a cycling loop. The wick material is commonly sintered metal powder, metal wire mesh, or metal cloth, etc. A part of the wick on the lower surface serves as the evaporator, where the heat from the attached heat generating device is absorbed by the evaporation of the working liquid. The working vapor spreads over the internal space of the enclosed chamber 11 to make it nearly isothermal. The vapor condenses on the top surface where a heat sink (not shown) is connected. The condensed liquid flows back to the evaporator via the wick, as shown in arrows in FIG. 1. There are at least two disadvantages for such a scheme. First, as the wick is porous, large friction tends to retard the liquid back flow and lead to dry-out at high heat loading. Second, as the vacuumed chamber faces with inward pressure, deformation is avoided either by inserting stiffeners or by locally squeezing the chamber to cause local contacts of the top and bottom layers (not shown).

To improve the first disadvantage, the porous wick 10 can be replaced with the parallel grooves 9, as shown in FIG. 2, to reduce the friction for liquid flow. Again, stiffeners are needed to withstand the inward pressure.

To improve the second disadvantage, U.S. Pat. No. 3,613,778 disclosed a structural wick 6a to withstand the inward pressure, as shown in FIG. 3. Two layers of porous wick 12 and 13 with parallel grooves 14 are disposed face to face within the enclosed metal chamber 11. The groove orientations of each wick layer are perpendicular. The space composed by the perpendicular grooves 14 serves as the vapor conduit, while the liquid conduit is the interior pores of the porous wick. The first disadvantage of large friction for liquid flow, however, is not improved in this embodiment.

U.S. Pat. No. 6,679,318 disclosed another single-layer, waffle-shaped structural wick made of sintered metal powders, to withstand the inward pressure. It also disclosed an anti-pressure layout with the upper and lower sections, both containing porous non-structural layers. The small pores within the lower-section wick layer serve as the liquid conduit, while the large pores within the upper-section metal wire mesh or metal open cell foam sheet serve as the vapor conduit.

U.S. Patent Application 2005-0183847-A1 disclosed a flat-plate heat pipe as shown in FIG. 4. The interior of the enclosed metal chamber 100 comprises the upper and lower sections designed for coolant cycling. The route for the working fluid is shown therein. The upper section includes a set of parallel V-shaped grooves 201 lying over the wick layer 203 in the lower section. Between the parallel grooves 201 and the wick layer 203 is disposed another dividing layer 205 made of permeable metal or nonmetal material. An open space 300 is thus retained for lateral vapor motion. When the heat pipe is heated with a CPU or other heat generating device, the working liquid (not shown) in the wick 203 evaporates. The vapor spreads over the upper section and condenses on the walls 202 of the parallel grooves 201, with the condensation heat dissipated out through the heat sink (not shown) connected with the upper chamber wall. The condensed liquid passes through the permeable dividing layer 205 to directly, without flowing through a long route, enter the wick layer 203 in the lower section. The evaporation of the liquid in the wick 203 leads to a liquid-vapor interface within the wick 203. This liquid-vapor interface results in a capillary pulling force on the working liquid on the groove walls 202 and in the wick 203 toward the evaporation region to make a full cycle: liquid→vapor→cooling→liquid following the arrows as shown in FIG. 4. However, when single or multiple layers of metal mesh or metal cloth is adopted as the wick 203, the wick tends to bump up without some kind of strengthener between the top wall and the wick 203 to press it down. This leads to attenuation of capillary force for the back flow of the working liquid and the subsequent dry-out.

The differences between this invention and the embodiment of U.S. Pat. No. 3,613,778 include: (1) The present groove structure is made of non-porous materials, preferably fabricated on the top chamber wall 101 as a unitary cover. In contrast, the embodiment of U.S. Pat. No. 3,613,778 adopts a structural porous wick, which can not be fabricated on the metal wall as a unit; (2) The present porous wick in the lower section is a simple non-structural wick layer, rather than a structural wick; (3) The vapor conduit in this invention is the upper-section channel space connected by the cut-off openings, in contrast with the cross-linked space of the upper and lower grooves; (4) The liquid conduit in this invention includes upper-section groove wall and groove corners and the lower-section wick pores, in comparison with the wick pores in both structural wick layers. The superiorities of this invention include: (1) When the grooves are fabricated on the top wall as a unit, the structure is simpler with better heat transfer characteristics because no contact thermal resistance exists between the grooves and the top chamber wall. In contrast the sintered-metal-powdered structural wick cannot be fabricated with the top wall as a unit. Contact thermal resistance exists between the wick and the top wall and retards the heat transfer across the top wall; (2) The friction of liquid flow associated with the groove corners and groove walls is much smaller than that associated with the fine pores within the wick, and (3) Both the upper-section groove structure and the lower plain wire-mesh wick layer in the are simpler and cheaper than the structural wick with grooves.

The differences between this invention and the embodiment of U.S. Pat. No. 6,679,318 include: (1) The present upper-section structure is a grooved structure made of non-porous materials, preferably fabricated on the top chamber wall 101 as a unitary cover. In contrast, the embodiments of U.S. Pat. No. 6,679,318 adopt porous wick made of either metal wire mesh or open cell foam sheet, which can not be fabricated on the metal wall as a unit; (2) The vapor conduit in this invention is the upper-section smooth channel space connected by the cut-off openings, in contrast with the internal non-smooth pores of the metal wire mesh or the open cell foam; (3) The liquid conduit in the upper section in this invention includes smooth groove wall and groove corners, in comparison with the non-smooth walls of the metal wire mesh or the open cell foam. The superiorities of this invention are: (1) When the grooves are fabricated on the top wall as a unit, the structure is simpler with better heat transfer characteristics because no contact thermal resistance exists between the grooves and the top chamber wall. In contrast, none of the waffle-shaped wick, metal wire mesh, or metal open cell foam can be fabricated with the top wall as a unit. Contact thermal resistance exists between the wick and the top wall and retards the heat transfer across the top wall; (2) The friction for vapor flow associated with the smooth groove walls is much smaller than that associated with the non-smooth. pores within the metal wire mesh or metal open cell foam; (3) The friction for liquid flow in the upper section associated with the smooth groove walls and groove corners is much smaller than that associated with the non-smooth surface of the metal wire mesh or metal open cell foam. Besides, a large number of corners exist at the intersecting locations of the mesh wires or the irregular foam surfaces. Their remarkable capillary force attracts and holds a considerable amount of working liquid. This tends to retard liquid cycling.

SUMMARY OF THE INVENTION

This invention solves the bumping-up problem for the metal-mesh evaporator in the prior art shown in FIG. 4. While both the permeable dividing layer 205 and the strengthener between the top wall and the wick 203 in FIG. 4 are eliminated, a plurality of openings on the groove walls are introduced to allow for efficient vapor distribution. With this simpler structure, better cooling capability can be attained.

DETAILED DESCRIPTION OF THE INVENTION

Figure 1:
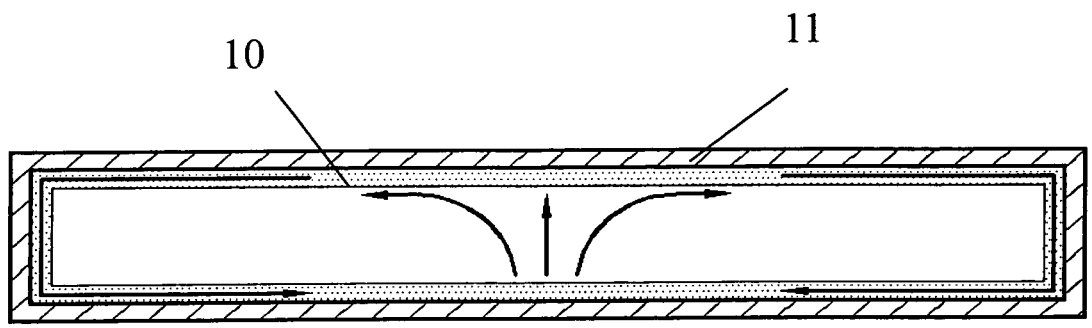
FIG. 1 Prior art.
Figure 2:
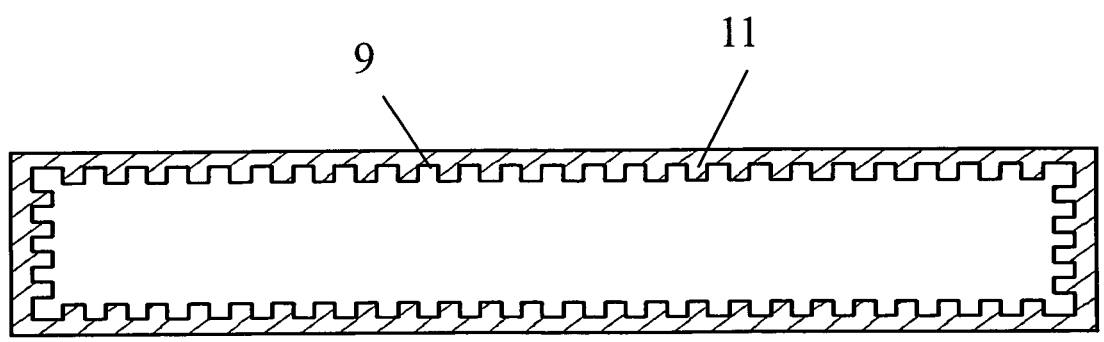
FIG. 2 Prior art.
Figure 3:
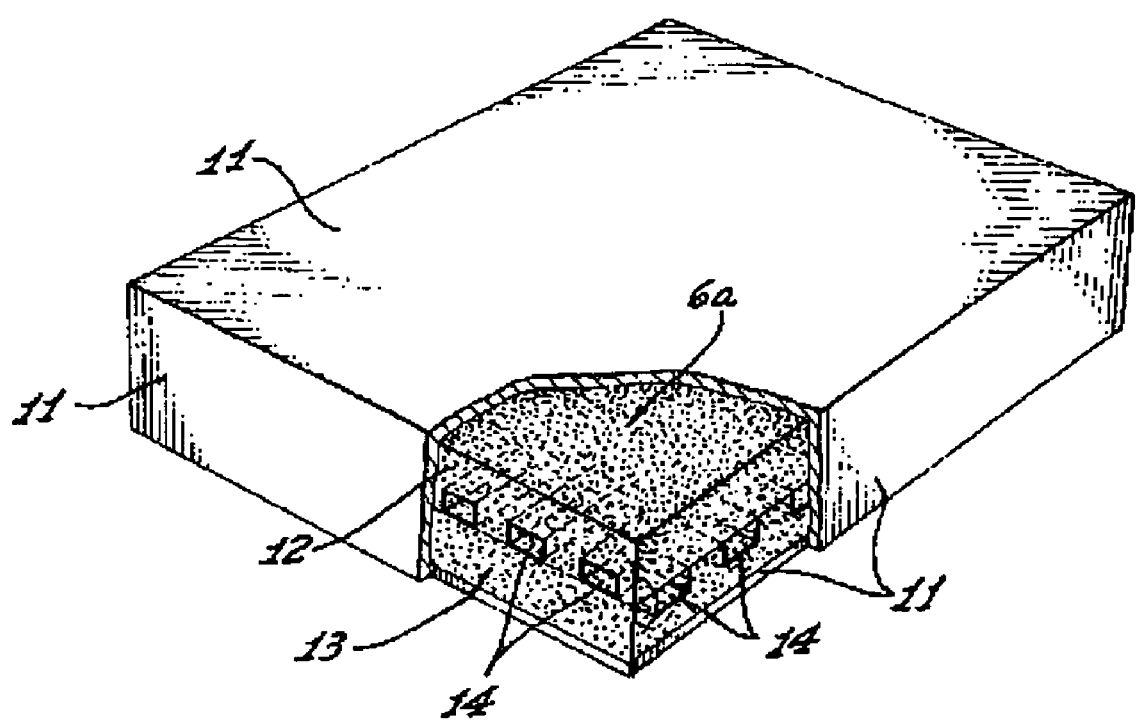
FIG. 3 Prior art.
Figure 4:
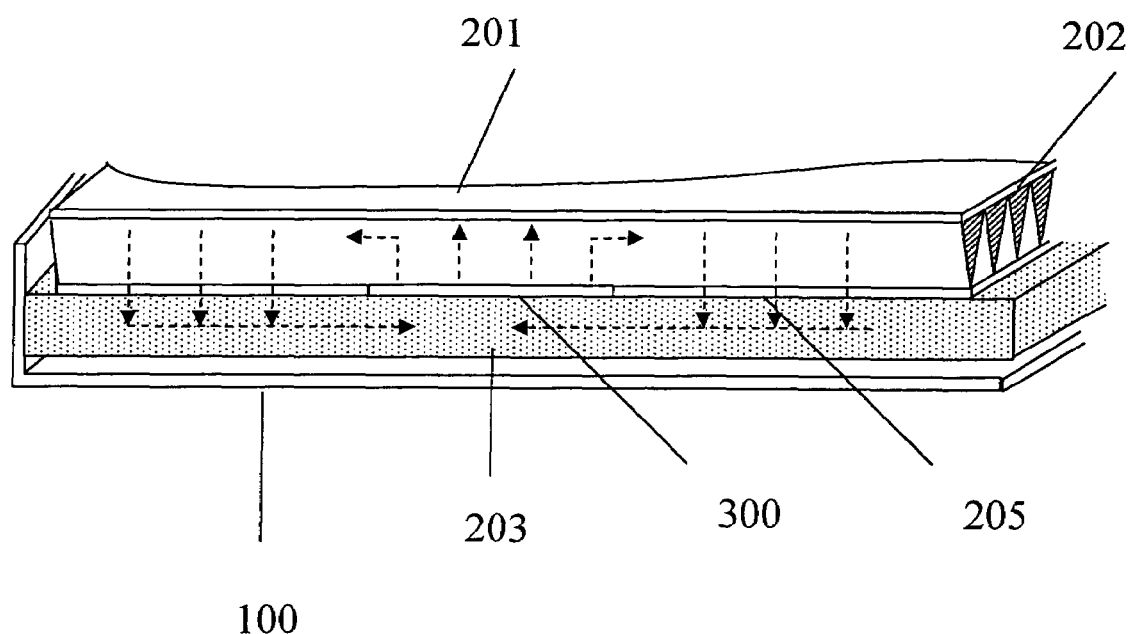
FIG. 4 Prior art.
Figure 5:
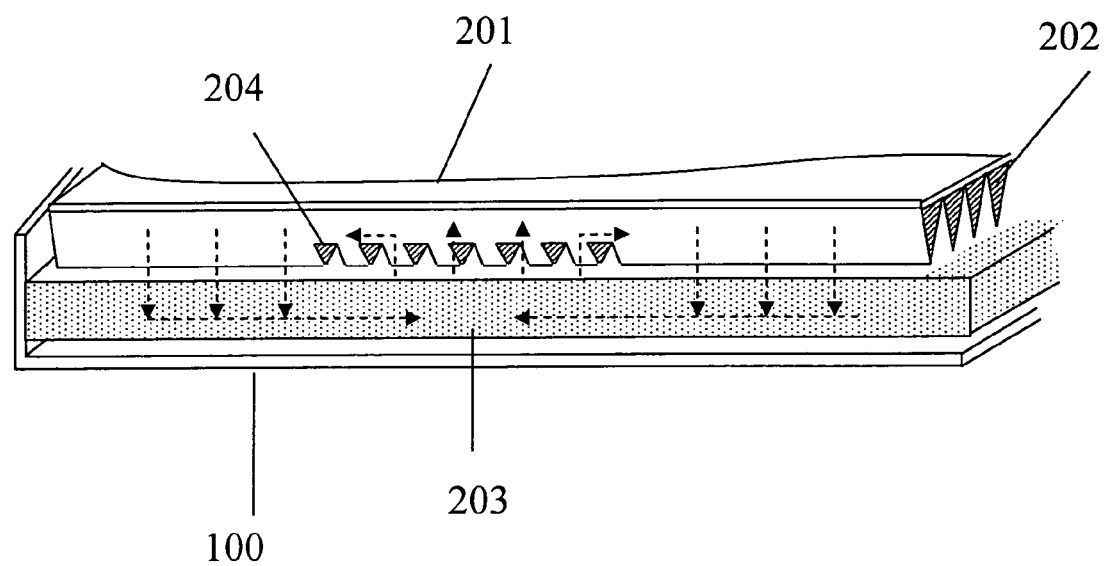
FIG. 5 Embodiment of this invention.
Figure 6:
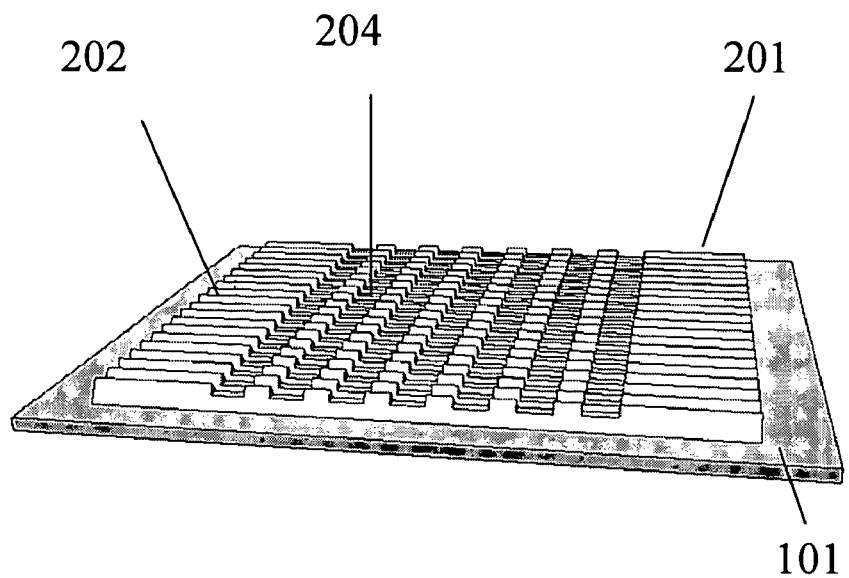
FIG. 6 The flipped parallel grooved top structure in FIG. 5.

FIG. 5 discloses a representative embodiment of this invention. The interior of the enclosed metal chamber 100 comprises the upper and lower sections designed for coolant cycling. The permeable dividing layer 205 as well as the open space 300 in FIG. 4 is eliminated so that the parallel grooves 201 contact directly with the wick 203. To allow for efficient vapor distribution, a plurality of cut-off openings 204 are made on the channel walls 202, as shown in FIG. 6. Further, as shown in FIGS. 5 and 6, the openings 204, when taking the form of recesses formed in channel walls 202, are only partially cut into the walls so as not to disrupt the continuity of the grooves 201 in their longitudinal direction. The openings distribute over at least the evaporation region so that the vapor generated therein can move freely to spread over the space in the upper section. The vapor then condenses on the channel walls 202 with the condensed liquid downward enters the wick 203 directly and is subsequently drawn back to the evaporator. The remaining wall sections between the openings 204 serve as the liquid path to the wick 203, the strengtheners to press down the wick layer 203, and the stiffeners between the top wall and the wick 203 to withstand the inward pressure. The cross-section of the grooves may be triangular, rectangular, trapezoidal, or arc-shaped, etc; the openings can be of arbitrary shape. The parallel groove structure 201 or the openings 204 could be made by machining, chemical etching, or other methods. To enhance water collection and heat transfer, the groove wall surface may be subjected to hydrophilic or hydrophobic treatment either physically (like sanding, scratching, carving, or grinding, etc.) or chemically (like acid soaking, oxidizing, or coating, etc.). The wick 203 can be made of sintered metal powder, or composed of single or multiple layers of metal wire mesh or metal cloth. To reduce the friction of the liquid back flow, micro-grooves can be fabricated on the bottom wall underneath the wick 203. The pattern of the micro-grooves can be parallel, radial, branching, intersecting, irregular, or the combination of the above (not shown).

Figure 7:
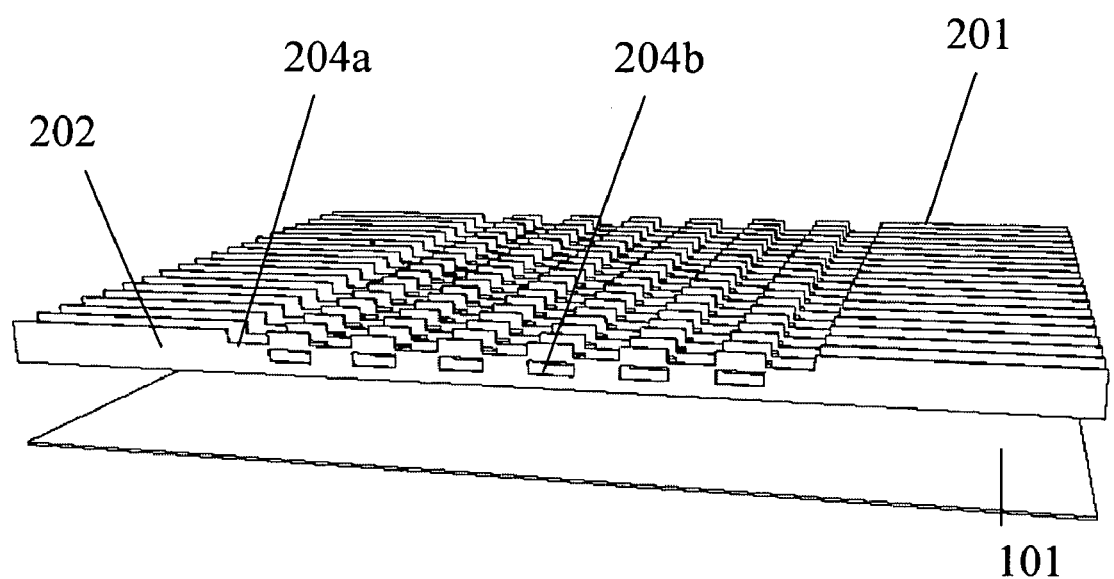
FIG. 7 Another embodiment of the parallel channels.

The parallel groove structure 201 in the upper section can be fabricated on the top wall 101 of the metal chamber 100 as a unitary cover, as shown in FIG. 6, or formed by disposing a separate structure comprising multiple dividing walls against the top chamber wall 101, as shown in FIG. 7. In the latter case, non-metal material can be used for the separate structure. FIG. 7 also discloses that the cut-off openings 204 can be either recess openings 204a or hole openings 204b. Although both types of openings are shown in FIG. 7, it is practical to use either one type of the two.

Figure 8:
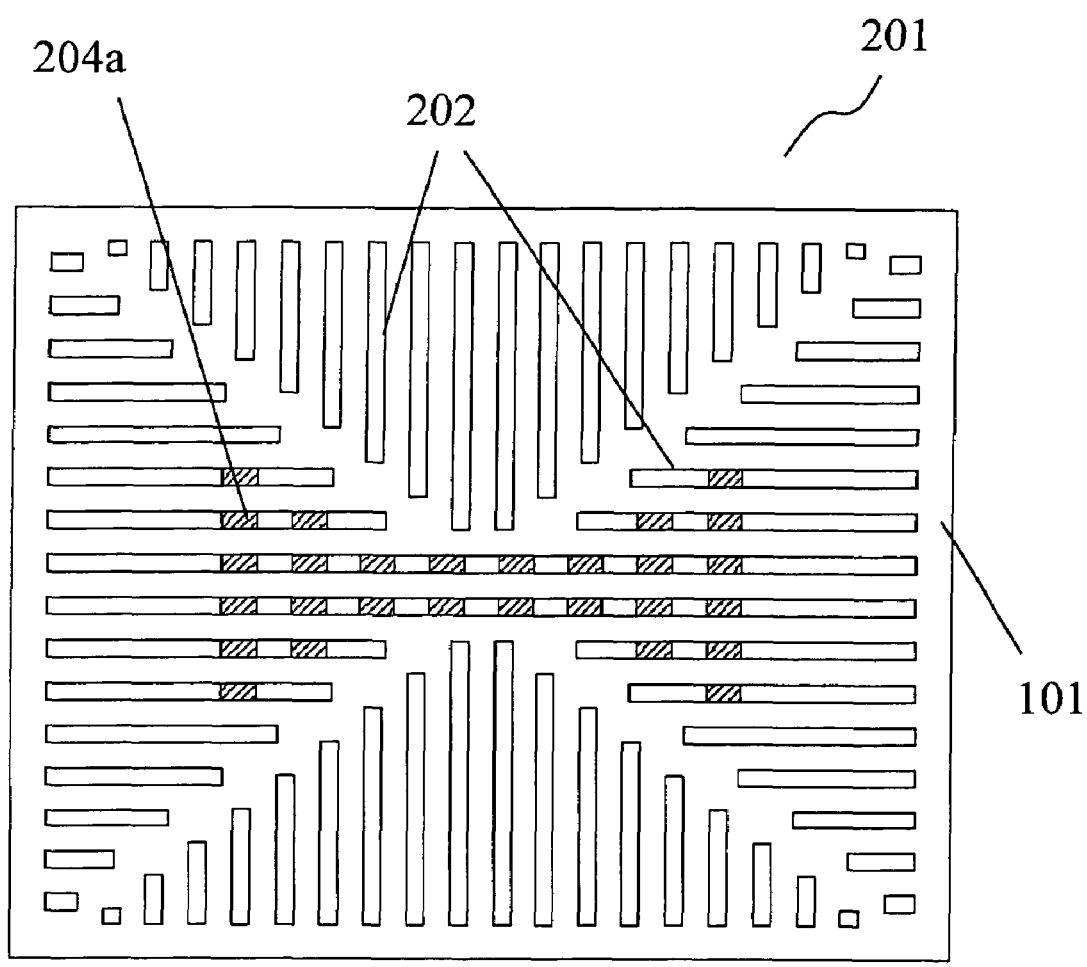
FIG. 8 Another embodiment with branching-patterned channels.

FIG. 8 discloses the top groove structure of another embodiment of this invention. The pattern of the grooves 201 is of a branching type. With the openings 204a on certain groove walls, the vapor can diffuse all over the interior space efficiently. The groove pattern is not limited to parallel or branching, but can be radial, intersecting, irregular, or the combination of the above. Since there can be unlimited combinations of the groove pattern, they are not elaborated here.

These embodiments can be placed horizontally or vertically. Multiple regions at any positions of the wick can be selected as the evaporation regions for multiple heat generating devices. The shape of the metal chamber 100 is not limited to rectangular but can be of any other shape as needed.

While the preferred embodiments of the invention have been described, it will be apparent to those skilled in the art that various modifications may be made without departing from the spirit of the present invention. Such modifications are all within the scope of this invention.

The invention claimed is:
1. A discrete flat-plate heat spreader for a heat generating device, comprising:
   an enclosed metal chamber, the chamber having a bottom, an exterior surface of the bottom being adapted to be disposed in contact with said heat generating device;
   a two-phase vaporizable coolant recycled in said chamber to remove heat from said heat generating device;
   a flow pathway comprising an upper section and a lower section, said upper section being in contact with an inner top surface of said chamber for vapor condensation and heat dissipation, said upper section having a set of continuous grooves configured to each be a vapor passage, the grooves being made of a non-porous metal, and configured to be in contact with said lower section, said grooves having side walls and edges configured to conduct condensed liquid coolant along a longitudinal direction of said grooves under capillary action toward said lower section, said lower section functioning as part of a recycling passage for the condensed coolant; and
   a wick in said lower section, said wick being disposed in heat exchange contact with an inner surface of the chamber bottom, a portion of said wick functioning as an evaporator and another portion of said wick functioning as a liquid passage to draw condensed coolant from said upper section via said grooves by capillary attraction force, said coolant collected within said evaporator wait- ing to be vaporized by the heat from said heat generating device disposed against the exterior surface of the chamber bottom; and a plurality of cut-out openings in the side walls of said grooves, said side walls being partially cut to define said cut-out openings without disrupting the continuity of said grooves in the longitudinal direction thereof, said cut-out openings being located at least over said wick and covering at least the area adapted to be in contact with said heat generating device to facilitate coolant vapor diffusing into said grooves to be condensed therein on said groove walls and in groove corners, and thereafter be induced to flow along said groove corners by the capillary action therein.

2. The heat spreader of claim 1, wherein said grooves have a cross-section selected from the group consisting of: V-shaped, triangular, rectangular, trapezoidal, and arc-shaped.

3. The heat spreader of claim 1, wherein said set of grooves are parallel grooves.

4. The heat spreader of claim 1, wherein said set of grooves are of a radially branching pattern.

5. The heat spreader of claim 1, wherein said grooves are made of a metal material.

6. The heat spreader of claim 5, wherein said grooves are integrated with the top of said chamber as a unitary cover.

7. The heat spreader of claim 1, wherein the cut-out openings in the side walls of the adjacent grooves are aligned with one another in rows that are transverse to the longitudinal direction of said grooves.

8. The heat spreader of claim 1, wherein the cut-out openings extend immediately from lowermost edges of the respective side walls upwardly for only a partial height of said side walls.

9. The heat spreader of claim 8, further comprising apertures each of which extends though a middle portion of the respective side wall and has a full 360 degree circumference.

10. The heat spreader of claim 9, wherein the apertures in the side walls of the adjacent grooves are aligned with one another in rows that are transverse to the longitudinal direction of said grooves.

11. The heat spreader of claim 1, wherein the cut-out openings are apertures extending through middle portions of the respective side walls and having a full 360 degree circumference.

12. The heat spreader of claim 11, wherein the apertures in the side walls of the adjacent grooves are aligned with one another in rows that are transverse to the longitudinal direction of said grooves.

* * * * *